United States Patent
Guo et al.

(10) Patent No.: US 12,302,647 B2
(45) Date of Patent: May 13, 2025

(54) PHOTOVOLTAIC CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhiqiu Guo, Zhejiang (CN); Jingguo Yang, Zhejiang (CN); Liqin Liu, Zhejiang (CN); Yingli Guan, Zhejiang (CN); Shiliang Huang, Zhejiang (CN)

(73) Assignees: ZHEJIANG JINKO SOLAR CO., LTD., Zhejiang (CN); JINKO SOLAR.CO., LTD, Jiangxi (CN)

( * ) Notice: Subject to any disclaimer, the term of this patent is extended or adjusted under 35 U.S.C. 154(b) by 0 days.

(21) Appl. No.: 18/480,432

(22) Filed: Oct. 3, 2023

(65) Prior Publication Data

US 2024/0274737 A1    Aug. 15, 2024

(30) Foreign Application Priority Data

Feb. 14, 2023   (CN) .......................... 202310173021.2

(51) Int. Cl.
*H10F 19/85*    (2025.01)
*H10F 19/20*    (2025.01)
(Continued)

(52) U.S. Cl.
CPC ........... *H10F 19/904* (2025.01); *H10F 19/20* (2025.01); *H10F 77/215* (2025.01); *H10F 19/85* (2025.01)

(58) Field of Classification Search
CPC ......... H01L 31/022433; H01L 31/0508; H01L 31/0475; H10F 77/937; H10F 77/215; H10F 19/904; H10F 19/85; H10F 19/20
See application file for complete search history.

(56) References Cited

U.S. PATENT DOCUMENTS

2008/0149161 A1*   6/2008   Nishida ................. H01L 31/042
                                                                        136/244
2012/0222740 A1    9/2012   Kim et al.
(Continued)

FOREIGN PATENT DOCUMENTS

CN    110993733 A    4/2020
CN    114823961 A    7/2022
(Continued)

OTHER PUBLICATIONS

Partial European Search Report of corresponding European Patent Application No. 23199616.6 issued on Apr. 2, 2024, 14 pages.
(Continued)

*Primary Examiner* — Uyen M Tran
(74) *Attorney, Agent, or Firm* — Knobbe, Martens, Olson & Bear, LLP

(57) ABSTRACT

A photovoltaic cell and a photovoltaic module. The photovoltaic cell includes a semiconductor substrate, a passivation layer arranged on a surface of the semiconductor substrate, a plurality busbars, and a plurality of electrode pads arranged on the passivation layer. Each of the plurality of electrode pads are electrically connected to an electrode line, and along a thickness direction of the photovoltaic cell, the plurality of electrode pads are arranged on a side of the plurality of busbars facing away from the passivation layer, or arranged on the passivation layer. Along a thickness direction of the photovoltaic cell, a vertical distance between a highest point of the plurality of electrode pads and a surface of the passivation layer is greater than or equal to a vertical distance between a highest point of the plurality of busbars and the surface of the passivation layer.

5 Claims, 6 Drawing Sheets

(51) Int. Cl.
  *H10F 19/90* (2025.01)
  *H10F 77/20* (2025.01)

(56) References Cited

U.S. PATENT DOCUMENTS

| | | | | |
|---|---|---|---|---|
| 2012/0325286 | A1* | 12/2012 | Hishida | H01L 31/0512 |
| | | | | 136/244 |
| 2014/0332072 | A1 | 11/2014 | Beaucarne et al. | |
| 2016/0020349 | A1 | 1/2016 | Hashimoto | |
| 2016/0322527 | A1* | 11/2016 | Hwang | H01L 31/0488 |
| 2018/0122973 | A1* | 5/2018 | Pilliod | H01L 31/02366 |
| 2018/0337297 | A1* | 11/2018 | Murofushi | H01L 31/0481 |
| 2022/0173261 | A1 | 6/2022 | Bettinelli | |

FOREIGN PATENT DOCUMENTS

| | | | | |
|---|---|---|---|---|
| CN | 115498055 | A | 12/2022 | |
| EP | 2897179 | B1 | 3/2019 | |
| ES | 2547680 | * | 10/2015 | |
| ES | 2547680 | T3 * | 10/2015 | B41N 1/24 |
| JP | 2007-287861 | A | 11/2007 | |
| JP | 2018-032491 | A | 3/2018 | |
| JP | 2018-056563 | A | 4/2018 | |
| JP | 2018-535557 | A | 11/2018 | |
| JP | 2020-057694 | A | 4/2020 | |
| KR | 10-1239793 | B1 | 3/2013 | |
| TW | 201709542 | * | 3/2017 | |
| TW | 201709542 | A * | 3/2017 | H01L 31/0504 |
| WO | WO 2018/173125 | A1 | 9/2018 | |
| WO | WO 2022/075456 | A1 | 4/2022 | |
| WO | WO 2022/143352 | A1 | 7/2022 | |

OTHER PUBLICATIONS

Notice of Refusal of corresponding Japanese Patent Application No. 2023-166738 issued on Jan. 16, 2024 in 12 pages.
Australian Office Action for Application No. 2023237055, mailed Aug. 29, 2024 (6 pages).

* cited by examiner

PHOTOVOLTAIC CELL AND PHOTOVOLTAIC MODULE

CROSS-REFERENCE TO RELATED APPLICATIONS

The present application claims priority to Chinese Patent Application No. 202310173021.2, filed on Feb. 14, 2023, the content of which is incorporated herein by reference in its entirety.

TECHNICAL FIELD

The present disclosure relates to the technical field of photovoltaic power generation, and in particular, to a photovoltaic cell and a photovoltaic module.

BACKGROUND

A photovoltaic module includes photovoltaic cells and electrode lines, and adjacent photovoltaic cells are electrically connected through the electrode lines to realize series and parallel connection between photovoltaic cells. Each of the photovoltaic cells includes a semiconductor substrate, a passivation layer, and busbars and electrode pads applied to a surface of the passivation layer. electrode pads are arranged at intervals along an extension direction of each of the busbars, and divide the busbar into connection lines. The electrode line is fixedly connected to the electrode pad, and the electrode line covers the busbar, to collect currents on the photovoltaic cells.

SUMMARY

The present disclosure provides a photovoltaic cell and a photovoltaic module, which reduce risks of deformation of and damage to the photovoltaic cell after soldering and cooling.

In a first aspect of the present application, a photovoltaic cell is provided, including:
- a semiconductor substrate;
- a passivation layer arranged on a surface of the semiconductor substrate;
- busbars arranged on the passivation layer, the busbars extending along a first direction, busbars being spaced apart along a second direction, and in the first direction and the second direction, one being a length direction of the photovoltaic cell, and the other being a width direction of the photovoltaic cell; and
- electrode pads configured to be electrically connected to an electrode line, and arranged on a side of the busbars facing away from the passivation layer along a thickness direction of the photovoltaic cell, or arranged on the passivation layer, one of the busbars including connection lines spaced apart along the first direction, and adjacent connection lines being electrically connected through the electrode pad;
- along the thickness direction of the photovoltaic cell, a vertical distance between a highest point of the electrode pad and a surface of the passivation layer is L1, and a vertical distance between the busbars and the surface of the passivation layer is L2, where L1 and L2 satisfy $L1 \geq L2$.

In the present disclosure, $L1 \geq L2$. When the electrode line is placed on the electrode pad, in the thickness direction of the photovoltaic cell, and/or in the first direction, and/or in the second direction, there is a gap between the electrode line and the busbar. After the electrode line and the electrode pad are soldered and fixed and is cooled to room temperature, a naturally bending portion of the electrode line is straightened under thermal expansion and cold contraction, thereby reducing risks of deformation of the electrode pad and warping of the semiconductor substrate caused by shrinkage of the electrode line and reducing risks of deformation of and damage to the photovoltaic cell after soldering and cooling.

In some embodiments, L1 and L2 satisfy $0 \leq L1-L2 \leq 0.5$ mm.

In some embodiments, along the thickness direction of the photovoltaic cell, when $L1 > L2$, the busbars have a cuboid structure extending along the first direction.

In some embodiments, along the thickness direction of the photovoltaic cell, part of the busbar is bent towards a direction close to the semiconductor substrate to form a first bending portion; and
- a projection of the first bending portion in the second direction is in a shape of U, V, or S.

In some embodiments, the semiconductor substrate is provided with a groove, and at least part of the first bending portion is located in the groove.

In some embodiments, along the second direction, a portion of one of the busbars is bent towards a direction away from the electrode pad to form a second bending portion; and
- a projection of the second bending portion in the thickness direction of the photovoltaic cell is in a shape of U, V, or S.

In some embodiments, a projection of one of the busbars in the second direction is in a shape of a rectangle.

In some embodiments, along the thickness direction of the photovoltaic cell, a portion of one of the busbars is bent towards a direction close to the semiconductor substrate to form a recessed portion; and
- a contour of a section of the recessed portion in the thickness direction of the photovoltaic cell is in a shape of an arc, U, or V.

In a second aspect of the present disclosure, a photovoltaic module is provided, including:
- photovoltaic cells, adjacent photovoltaic cells being electrically connected through an electrode line, one of the photovoltaic cells including a first surface and a second surface arranged oppositely along an own thickness direction, the first surface being located on a side facing sunlight;
- first photovoltaic glass arranged on the first surface, a first adhesive film being arranged between the first photovoltaic glass and the first surface; and
- a back support structure arranged on the second surface, a second adhesive film being arranged between the back support structure and the second surface;
- the back support structure being a back sheet or second photovoltaic glass;
- wherein the photovoltaic cell includes a semiconductor substrate, a passivation layer, busbars, and electrode pads, and the electrode line is electrically connected to the electrode pads;
- the passivation layer is arranged on a surface of the semiconductor substrate;
- each of the busbars is arranged on the passivation layer, the busbar extends along a first direction, busbars are spaced apart along a second direction, and in the first direction and the second direction, one is a length direction of the photovoltaic cell, and the other is a width direction of the photovoltaic cell;

along a thickness direction of the photovoltaic cell, the electrode pad is arranged on a side of the busbar away from the passivation layer, or each of the electrode pads is arranged on the passivation layer, the busbar includes connection lines spaced apart along the first direction, and adjacent connection lines are electrically connected through the electrode pad; and along the thickness direction of the photovoltaic cell, a vertical distance between a highest point of the electrode pad and a surface of the passivation layer is L1, and a vertical distance between the busbars and the surface of the passivation layer is L2, where L1 and L2 satisfy L1≥L2.

In the present disclosure, there is a gap between the electrode line and the busbar, which increases a deformation margin of the electrode line, and reduces risks of deformation of the electrode pad and warping of the semiconductor substrate caused by shrinkage of the electrode line. During machining, assembly, and use of the photovoltaic module, risks of shrinkage of and damage to the electrode line and deformation of the photovoltaic cell caused by changes in ambient temperature and changes in a temperature of the photovoltaic module are reduced, thereby improving operation stability of the photovoltaic module and prolonging the service life of the photovoltaic module.

In some embodiments, a diameter d of the electrode line satisfies 0.1 mm≤d≤0.5 mm.

It should be understood that the general description above and the detailed description in the following are merely exemplary and illustrative, and cannot limit the present disclosure.

REFERENCE SIGNS

Figure 1:
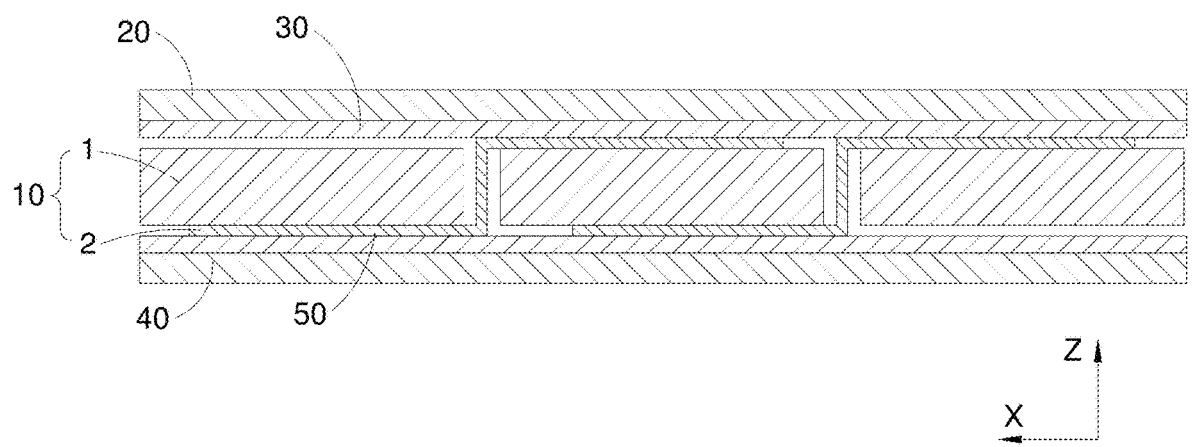
FIG. 1 is a sectional view of a photovoltaic module according to the present disclosure in some embodiments.

1: photovoltaic cell;
  11: busbar;
    111: connection line;
    112: first bending portion;
    113: second bending portion;
    114: recessed portion;
  12: electrode pad;
  13: semiconductor substrate;
    131: groove;
  14: passivation layer;
2: electrode line;
  21: connecting region;
  22: suspending region;
10: photovoltaic cell string;
20: first photovoltaic glass;
30: first adhesive film;
40: second adhesive film;
50: back support structure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better understand the technical solutions of the present disclosure, embodiments of the present disclosure will be described in detail below in conjunction with the accompanying drawings.

It should be clear that the described embodiments are only some rather than all of the embodiments of the present disclosure. Based on the embodiments in the present disclosure, all other embodiments obtained by those of ordinary skill in the art without creative efforts fall within the protection scope of the present disclosure.

Terms used in the embodiments of the present disclosure are only for the purpose of describing specific embodiments, and are not intended to limit the present disclosure. Singular forms of "a/an", "the", and "said" used in the embodiments of the present disclosure and the appended claims are intended to include plural forms, unless otherwise clearly specified in the context.

It should be understood that the term "and/or" used herein describes an association relationship between associated objects and represents that three relationships may exist. For example, A and/or B may represent the following three cases: only A exists, both A and B exist, and only B exists. In addition, the character "/" herein generally indicates an "or" relationship between the associated objects.

It is to be noted that orientation terms such as "up", "down", "left", and "right" described in the embodiments of the present disclosure are described from the perspective shown in the accompanying drawings, and should not be construed as limiting the embodiments of the present disclosure. Besides, in this context, it is to be further understood that one element described as being connected "on" or "under" another element not only means that the element may be directly connected "on" or "under" the another element, but also means that the element may be indirectly connected "on" or "under" the another element through an intermediate element.

In the related art, the electrode line is directly attached to the surface of the photovoltaic cell. After the electrode line and the electrode pad are soldered and fixed at a certain soldering temperature, when the electrode line and the photovoltaic cell are cooled to room temperature, due to different thermal expansion coefficients of the electrode line and the photovoltaic cell, shrinkage of the electrode line leads to warping of the photovoltaic cell, increasing a risk of damage to the photovoltaic cell.

Figure 2:
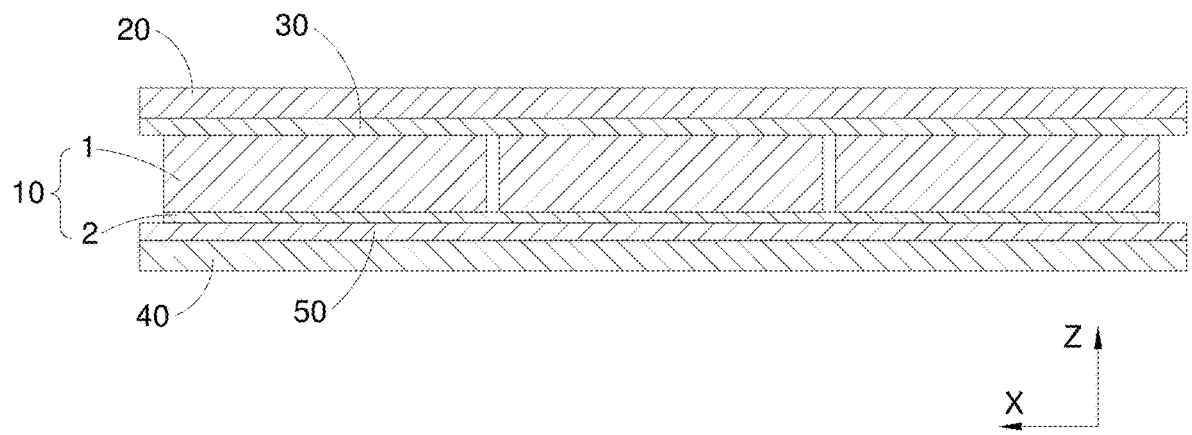
FIG. 2 is a sectional view of the photovoltaic module according to the present disclosure in some other embodiments.

Some embodiments of the present disclosure provide a photovoltaic module. As shown in FIG. 1 and FIG. 2, the photovoltaic module includes first photovoltaic glass 20, a first adhesive film 30, a photovoltaic cell string 10, a second adhesive film 40, and a back support structure 50. Along a thickness direction of the photovoltaic module, the first adhesive film 30 and the second adhesive film 40 are oppositely arranged on two sides of the photovoltaic cell string 10, and the first adhesive film 30 is located on a side of the photovoltaic cell string 10 facing sunlight. The first photovoltaic glass 20 is arranged on a side of the first adhesive film 30 away from the photovoltaic cell string 10, and the back support structure 50 is arranged on a side of the second adhesive film 40 away from the photovoltaic cell string 10. The photovoltaic cell string 10 includes photovoltaic cells 1, and adjacent photovoltaic cells 1 are electrically connected through an electrode line 2 to improve operation efficiency and operation performance of the photovoltaic module.

In some embodiments, the back support structure 50 may be a back sheet. That is, the back support structure 50 is made of an opaque material to enhance structural strength of a side of the photovoltaic module facing away from the sunlight and facilitate mounting of the photovoltaic module, thereby simplifying a mounting structure of the photovoltaic module and shortening a mounting cycle of the photovoltaic module. In this case, the photovoltaic module is a single glass module.

In some other embodiments, the back support structure 50 is second photovoltaic glass. That is, the back support structure 50 is made of a light-transmitting material, so that the side of the photovoltaic module facing away from the sunlight can absorb part of the light, thereby improving utilization of the sunlight by the photovoltaic module and improving photoelectric conversion efficiency of the photovoltaic module. In this case, the photovoltaic module is a double glass module. A specific material and a type of the back support structure 50 and a type of the photovoltaic module are not limited in the embodiments of the present disclosure.

A diameter d of the electrode line 2 satisfies 0.1 mm≤d≤0.5 mm. For example, the diameter of the electrode line 2 may be 0.1 mm, 0.2 mm, 0.35 mm, 0.46 mm, 0.5 mm, or the like, so as to facilitate machining of the electrode line 2 and reduce a material cost and a machining cost of the electrode line 2. At the same time, 0.1 mm≤d≤0.5 mm, which increases flexibility of a size of the electrode line 2, thereby improving replaceability of the electrode line 2, so as to facilitate subsequent maintenance and replacement of the electrode line 2 and reduce a maintenance cost of the photovoltaic module.

A thickness of the photovoltaic cell 1 is less than or equal to 140 μm. For example, the thickness of the photovoltaic cell 1 may be 100 μm, 115 μm, 126 μm, 132 μm, 140 μm, or the like, so as to facilitate machining of the photovoltaic cell 1 and reduce a material cost and a machining cost of the photovoltaic cell 1.

A side of the photovoltaic cell 1 facing the sunlight is a front surface of the photovoltaic cell 1, and a side of the photovoltaic cell 1 facing away from the sunlight is a back surface of the photovoltaic cell 1.

In some embodiments, as shown in FIG. 1, the electrode line 2 has one end located on the back surface of the photovoltaic cell 1 and the other end bending and extending along a thickness direction of the photovoltaic cell 1, and is connected to front surfaces of adjacent photovoltaic cells 1, so as to improve stability of connection between the electrode line and the adjacent photovoltaic cells 1.

In some other embodiments, as shown in FIG. 2, the electrode line 2 is located on the back surface of the photovoltaic cell 1. In this case, the photovoltaic cell 1 is a back contact cell, and the electrode line 2 is located on the back surface of the photovoltaic cell 1, which reduces shielding of the front surface of the photovoltaic cell 1 by the electrode line 2, thereby increasing a sunlight receiving area of the front surface of the photovoltaic cell 1 and then improving photoelectric conversion efficiency of the photovoltaic cell 1.

When the photovoltaic cell string 10 has a structure as shown in FIG. 1, that is, when the electrode line 2 has one end soldered and fixed to the back surface of the photovoltaic cell 1 and the other end fixed to the front surface of the adjacent photovoltaic cell 1, after the photovoltaic cell string 10 has been soldered and is cooled to room temperature, the electrode line 2 shrinks under thermal expansion and cold contraction. Since the front surface and the back surface of the photovoltaic cell 1 are fixedly connected to the electrode line 2, shrinkage of the electrode line 2 has little effect on warping of the photovoltaic cell 1.

When the photovoltaic cell 1 is the back contact cell, that is, only the back surface of the photovoltaic cell 1 is fixedly connected to the electrode line 2, after the photovoltaic cell string 10 has been soldered and is cooled to room temperature, the electrode line 2 shrinks under thermal expansion and cold contraction, and the photovoltaic cell 1 may warp towards a direction of the electrode line 2 under the pulling of the electrode line 2, so there is a risk of damage to the photovoltaic cell 1.

In order to solve the problem of the warping of the back contact cell, in a second aspect, some embodiments of the present disclosure provide a photovoltaic cell 1. As shown in FIG. 3 to FIG. 12, the photovoltaic cell 1 includes a semiconductor substrate 13, a passivation layer 14, busbars 11, and electrode pads 12. The electrode line 2 is electrically connected to the electrode pad 12. The passivation layer 14 is arranged on a surface of the semiconductor substrate 13. The busbar 11 is arranged on a surface of the passivation layer 14. The busbar 11 extends along a first direction X, and busbars 11 are spaced apart along a second direction Y. In the first direction X and the second direction Y, one is a length direction of the photovoltaic cell 1, and the other is a width direction of the photovoltaic cell 1.

Figure 3:
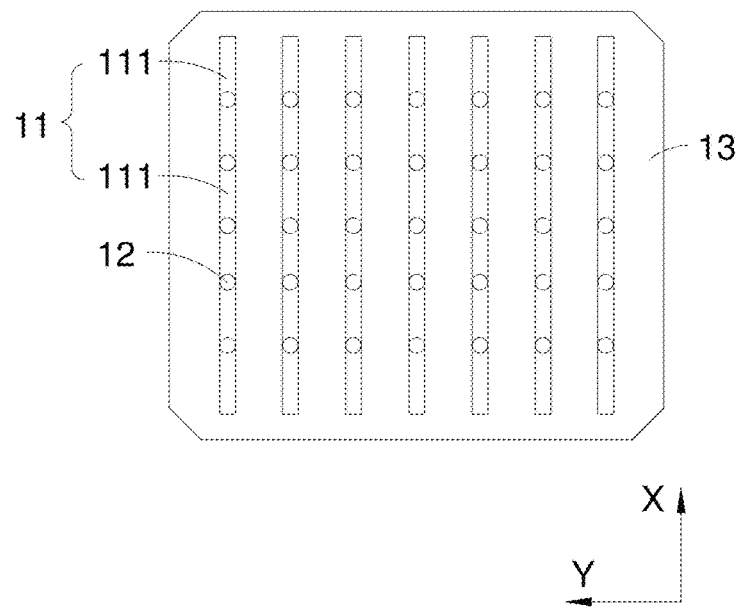
FIG. 3 is a schematic diagram of a surface structure of a photovoltaic cell according to the present disclosure in some embodiments.
Figure 4:
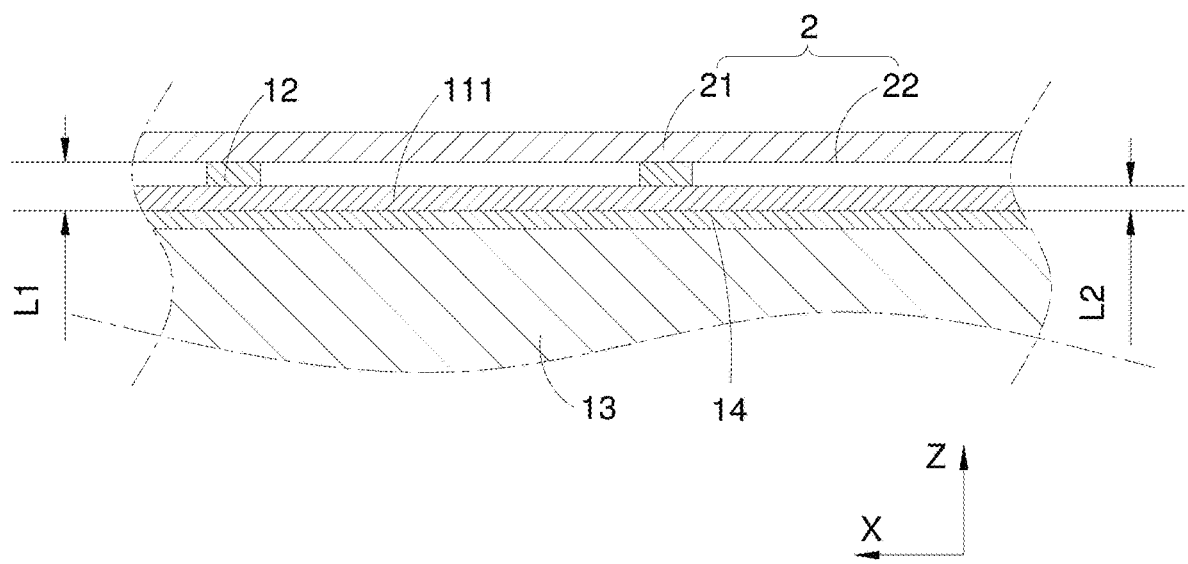
FIG. 4 is a schematic diagram of a partial structure of the photovoltaic cell in FIG. 3 connected to an electrode line in some embodiments, where the electrode line is in a shrunk state.

In some embodiments, as shown in FIG. 3 and FIG. 4, along a thickness direction Z of the photovoltaic cell 1, the electrode pad 12 is arranged on a side of the busbar 11 away from the passivation layer 14. That is, during manufacturing of the photovoltaic cell 1, the busbar 11 is manufactured on the passivation layer 14 first, and then the electrode pad 12 is manufactured on the busbar 11. A vertical distance between a highest point of the electrode pad 12 and the surface of the passivation layer 14 is L1, and a vertical distance between the busbar 11 and the surface of the passivation layer 14 is L2. L1>L2.

When the electrode line 2 is placed on the electrode pad 12, in the thickness direction Z of the photovoltaic cell 1, there is a gap between the electrode line 2 and the busbar 11, so that a connecting region 21 for connection with the electrode pad 12 and a suspending region 22 in a suspended state located above the gap are formed on the electrode line 2. When the electrode line 2 is placed on the electrode pad 12 and the electrode line 2 is not soldered and fixed to the photovoltaic cell 1, at least part of the suspending region 22 can bend into the gap, thereby increasing a deformation margin of the electrode line 2. After the electrode line 2 is soldered and fixed to the electrode pad 12 and is cooled to room temperature, part of the suspending region 22 naturally bent on the electrode line 2 is straightened under thermal expansion and cold contraction, thereby reducing risks of deformation of the electrode pad 12 and warping of the semiconductor substrate 13 caused by shrinkage of the electrode line 2 and reducing a risk of deformation of and damage to the photovoltaic cell 1 after soldering and cooling. At the same time, during machining, assembly, and use of the photovoltaic module, risks of shrinkage of and damage to the electrode line 2 and deformation of the photovoltaic cell 1 caused by changes in ambient temperature and changes in a temperature of the photovoltaic module are reduced, thereby improving operation stability of the photovoltaic module and prolonging the service life of the photovoltaic module.

Figure 5:
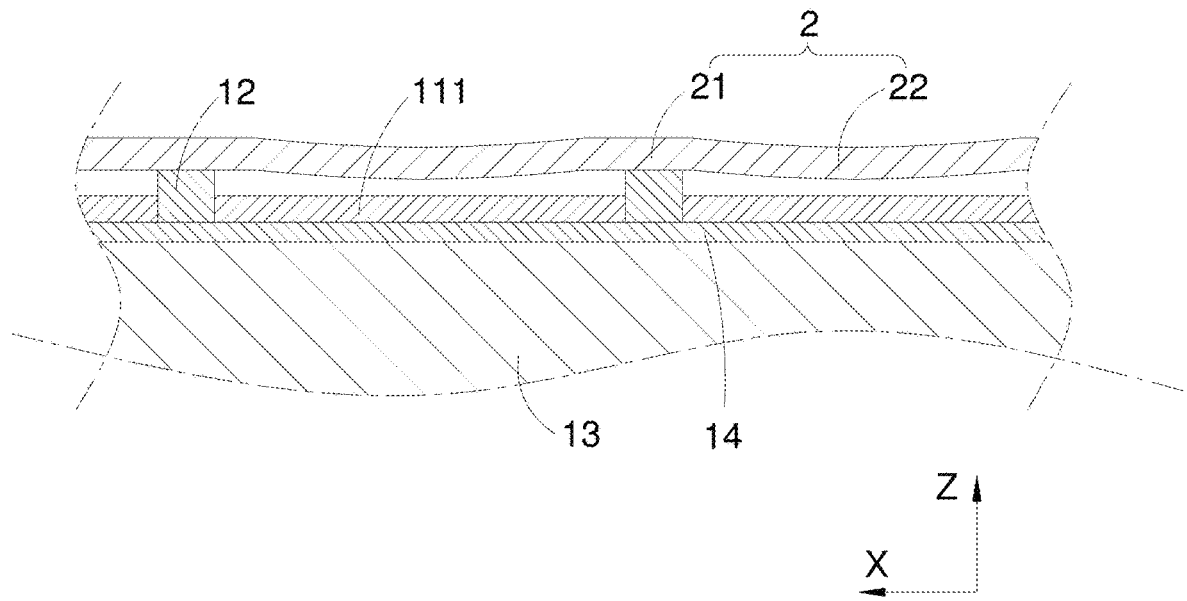
FIG. 5 is a schematic diagram of a partial structure of the photovoltaic cell in FIG. 3 connected to the electrode line in some other embodiments, where the electrode line is in an unshrunk state.
Figure 6:
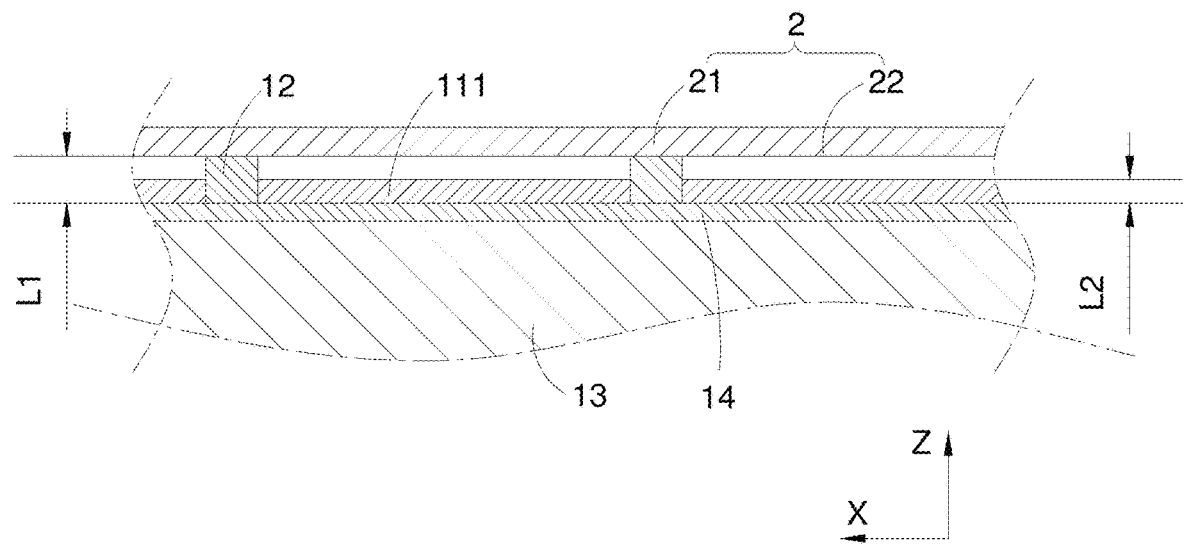
FIG. 6 is a schematic structural diagram of the electrode line in FIG. 5 after shrinkage.

In some other embodiments, as shown in FIG. 3, FIG. 5, and FIG. 6, the electrode pad 12 is arranged on the passivation layer 14, the busbar 11 includes connection lines 111 spaced apart along the first direction X, and adjacent connection lines 111 are electrically connected through the electrode pads 12. That is, the electrode pads 12 and the busbars 11 are simultaneously manufactured during the manufacturing of the photovoltaic cell 1. L1≥L2. When the electrode line 2 is placed on the electrode pad 12, in the thickness direction Z of the photovoltaic cell 1, and/or in the first direction X, and/or in the second direction Y, there is a gap between the electrode line 2 and the busbar 11, so as to reduce risks of deformation of the electrode pad 12 and warping of the semiconductor substrate 13 caused by shrinkage of the electrode line 2, thereby reducing a risk of deformation of and damage to the photovoltaic cell 1 after soldering and cooling. At the same time, risks of shrinkage of and damage to the electrode line 2 and deformation of the photovoltaic cell 1 caused by changes in ambient temperature and changes in a temperature of the photovoltaic module are reduced, thereby improving operation stability of the photovoltaic module and prolonging the service life of the photovoltaic module.

A specific structure of the busbar 11 is shown in FIG. 5 to FIG. 12. In some embodiments, along the thickness direction Z of the photovoltaic cell 1, when L1>L2, as shown in FIG. 5 and FIG. 6, the busbar 11 has a cuboid structure extending along the first direction X. That is, along the first direction X, the thickness of the busbar 11 is consistent, so as to simplify the structure of the busbar 11 and reduce the manufacturing cost of the busbar 11. In this embodiment, when the electrode line 2 is placed on the electrode pad 12, there is a gap between the electrode line 2 and the busbar 11 in the thickness direction Z of the photovoltaic cell 1.

Figure 7:
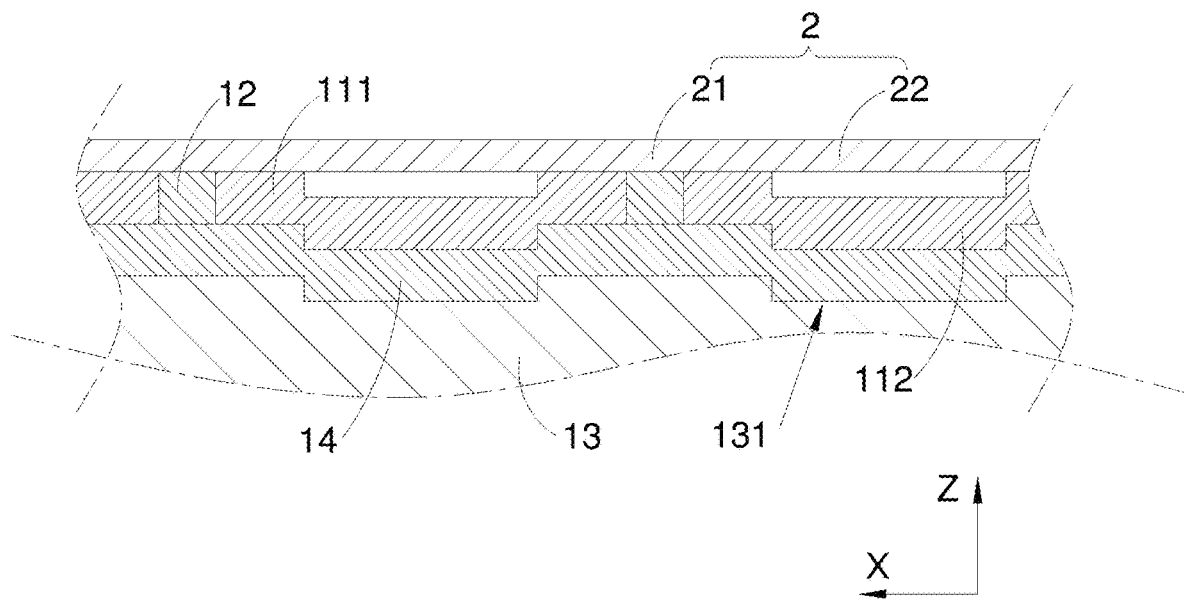
FIG. 7 is a schematic diagram of a partial structure of the photovoltaic cell in FIG. 3 connected to the electrode line in some other embodiments, where the electrode line is in a shrunk state.
Figure 9:
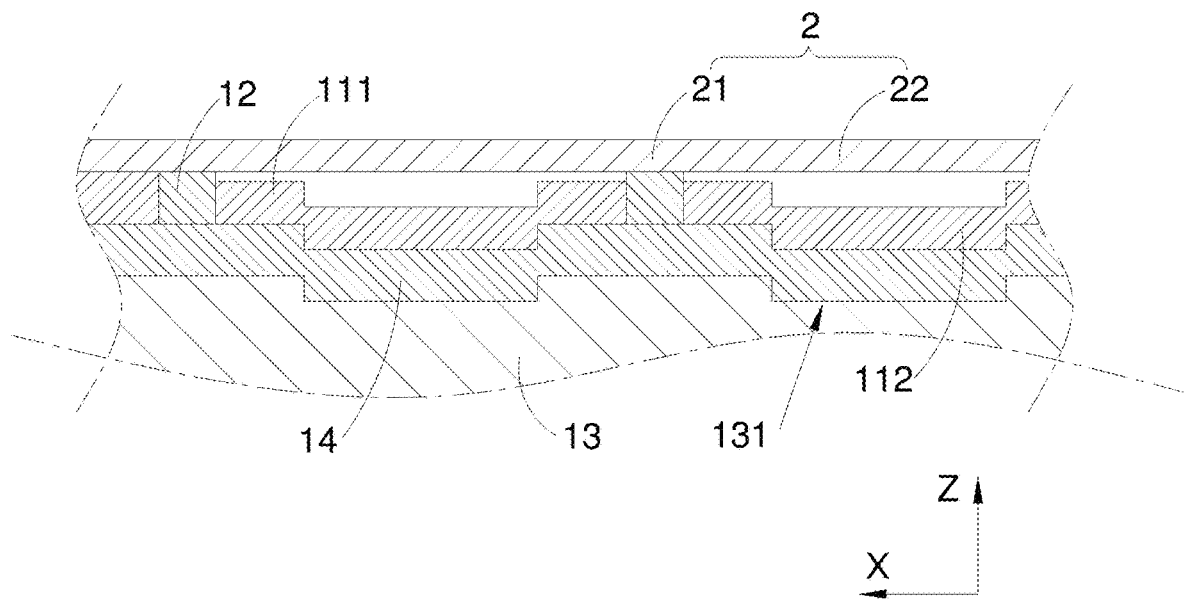
FIG. 9 is a schematic diagram of a partial structure of the photovoltaic cell in FIG. 3 connected to the electrode line in some other embodiments, where the electrode line is in a shrunk state.

In some other embodiments, the structure of the busbar 11 is shown in FIG. 7 and FIG. 9. Along the thickness direction Z of the photovoltaic cell 1, part of the busbar 11 is bent towards a direction close to the semiconductor substrate 13 to form a first bending portion 112, so that there is a gap between the electrode line 2 and the busbar 11 in the thickness direction Z of the photovoltaic cell 1.

In this embodiment, when L1=L2, as shown in FIG. 7, part of the busbar 11 can support the electrode line 2, which increases an expansion/contraction margin of the electrode line 2, also increases stability of a connection structure between the electrode line 2 and the photovoltaic cell 1, and reduces a risk of damage due to a small contact area between the electrode line 2 and the electrode pad 12. When L1>L2, as shown in FIG. 9, the busbar 11 is provided with the first bending portion 112, which can increase thicknesses of the busbar 11 and the electrode line 2 and also increase a distance between the electrode line 2 and the busbar 11, thereby reducing risks of short service life and poor operation efficiency of the photovoltaic cell 1 caused by a thin busbar 11 and improving operation stability of the photovoltaic cell 1.

Furthermore, a projection of the first bending portion 112 in the second direction Y is in a shape of U, V, or S or has other deformed structures. The specific shape of the first bending portion 112 is not limited in the present disclosure.

For example, as shown in FIG. 7 and FIG. 9, the semiconductor substrate 13 is provided with a groove 131, and at least part of the first bending portion 112 is located in the groove 131.

In this embodiment, part of the passivation layer 14 is located in the groove 131, so that the passivation layer 14 has a pit recessed along the thickness direction Z of the photovoltaic cell 1, and at least part of the first bending portion 112 is located in the pit, which reduces risks of local protrusion of the busbar 11 and abutment against the electrode line 2 caused by interference of the first bending portion 112 with the passivation layer 14, thereby improving flatness of the busbar 11 on the surface of the passivation layer 14 and improving accuracy and stability of a distance between the first bending portion 112 and the electrode line 2.

Figure 8:
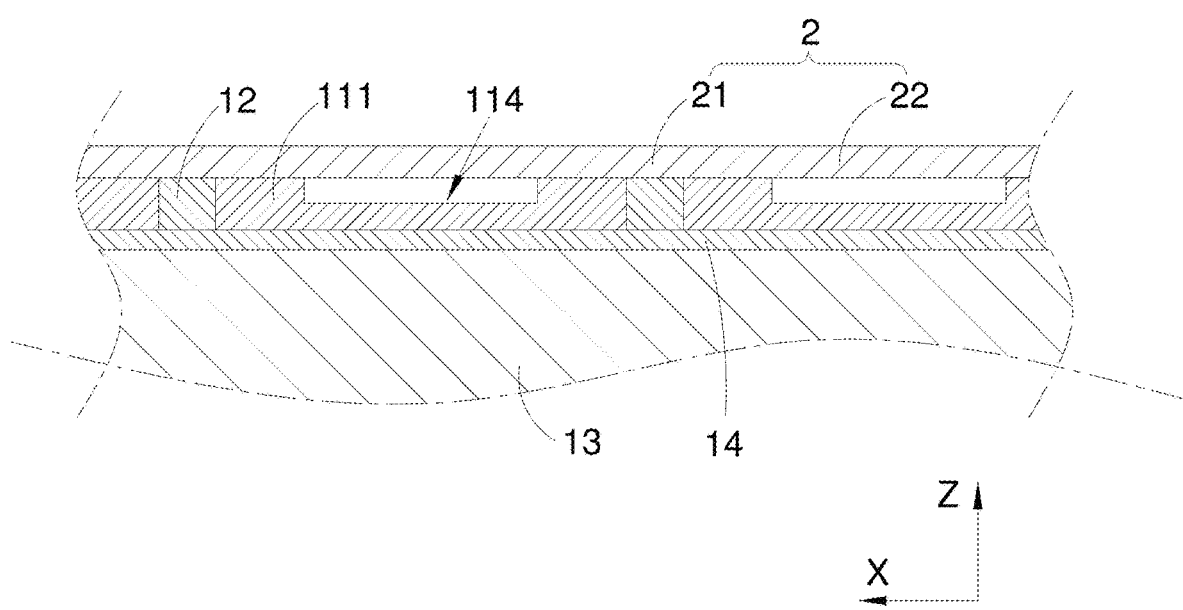
FIG. 8 is a schematic diagram of a partial structure of the photovoltaic cell in FIG. 3 connected to the electrode line in some other embodiments, where the electrode line is in a shrunk state.
Figure 10:
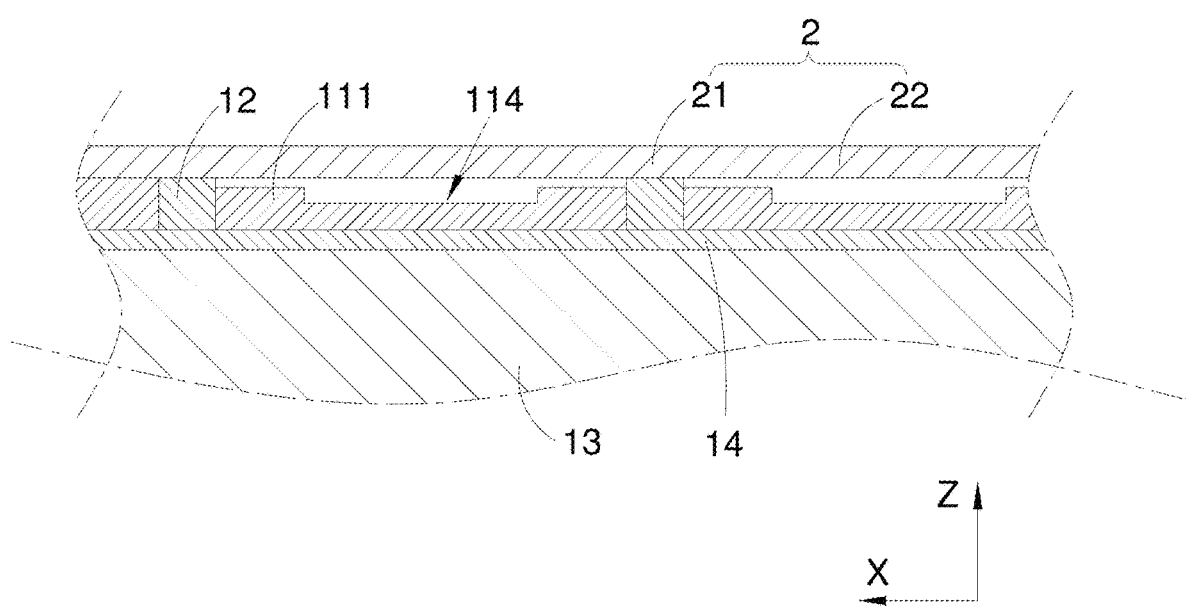
FIG. 10 is a schematic diagram of a partial structure of the photovoltaic cell in FIG. 3 connected to the electrode line in some other embodiments, where the electrode line is in a shrunk state.

In some other embodiments, the structure of the busbar 11 is shown in FIG. 8 and FIG. 10. Along the thickness direction Z of the photovoltaic cell 1, part of the busbar 11 is bent towards the direction close to the semiconductor substrate 13 to form a recessed portion 114. That is, along the first direction X, the thickness of the busbar 11 is inconsistent, and the thickness of the busbar 11 decreases at the recessed portion 114. As a result, there is a gap between the electrode line 2 and the busbar 11 in the thickness direction Z of the photovoltaic cell 1.

In this embodiment, the busbar 11 is provided with the recessed portion 114, which meets a requirement for the gap between the electrode line 2 and the busbar 11 and also simplifies structures of the busbar 11 and the semiconductor substrate 13, thereby simplifying manufacturing processes of the semiconductor substrate 13, the passivation layer 14, and the busbar 11, reducing manufacturing costs of the semiconductor substrate 13, the passivation layer 14, and the busbar 11, and shortening manufacturing cycles of the semiconductor substrate 13, the passivation layer 14, and the busbar 11. At the same time, the busbar 11 is provided with the recessed portion 114, which can reduce a height of the electrode pad 12, thereby reducing machining difficulty and a machining cost, i.e., a material cost, of the electrode pad 12. At the same time, structural stability of the electrode pad 12 is improved, and a risk of damage to the electrode pad 12 due to an external force during machining, mounting, transportation, and use is reduced, thereby prolonging the service life of the electrode pad 12, prolonging the service life of the photovoltaic cell 1 and the photovoltaic module, and improving operation stability of the photovoltaic cell 1 and the photovoltaic module.

Furthermore, a contour of a section of the recessed portion 114 in the thickness direction Z of the photovoltaic cell 1 is in a shape of an arc, U, or V or has other deformed structures. The specific shape of the recessed portion 114 is not limited in the present disclosure.

Figure 11:
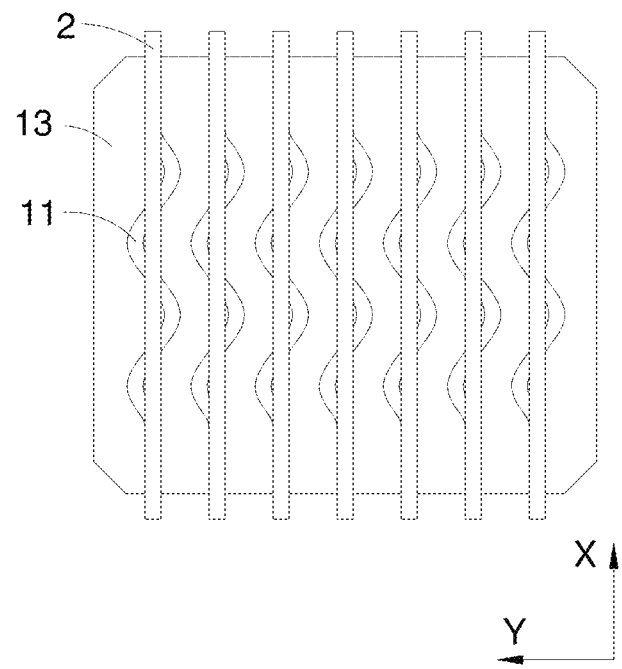
FIG. 11 is a schematic structure diagram of the photovoltaic cell according to the present disclosure connected to the electrode line in some other embodiments.
Figure 12:
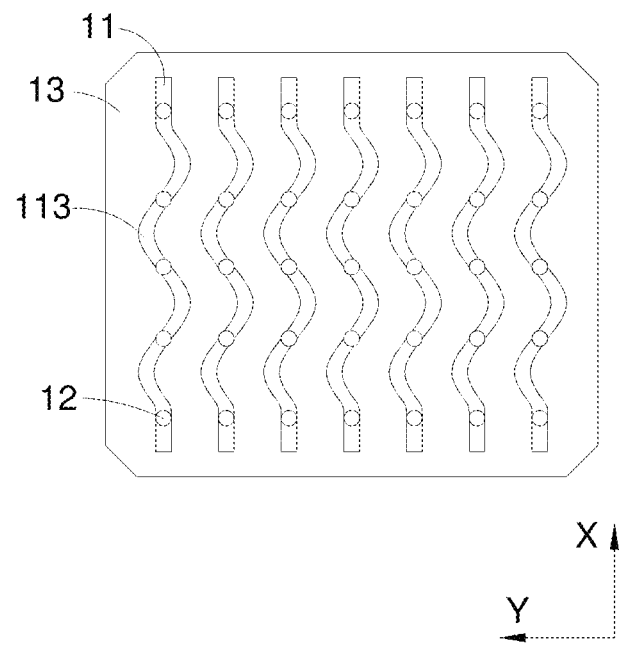
FIG. 12 is a schematic diagram of a surface structure of the photovoltaic cell in FIG. 11.

In some other embodiments, the structure of the busbar 11 is shown in FIG. 11 and FIG. 12. Along the second direction Y, part of the busbar 11 is bent towards a direction away from the electrode pad 12 to form a second bending portion 113. That is, in a plane defined by the first direction X and the second direction Y, part of the busbar 11 is bent and deformed towards two sides of the electrode line 2 to form the second bending portion 113. As a result, there is a gap between the electrode line 2 and the busbar 11 in the first direction X and/or the second direction Y. In this case, the second bending portion 113 is located on one side or two sides of the suspending region 22 in the second direction Y.

In this embodiment, the busbar 11 is provided with the second bending portion 113 bent in the plane defined by the first direction X and the second direction Y, so that L1 may be equal to L2, thereby simplifying machining procedures of the electrode pad 12 and the busbar 11 and reducing machining difficulty and a machining cost of the busbar 11.

Furthermore, One or more second bending portions 113 may be provided. second bending portions 113 are distributed along the first direction X, and bent directions of adjacent second bending portions 113 are opposite. A projection of the second bending portion 113 in the thickness direction Z of the photovoltaic cell 1 is in a shape of U, V, or S or has other deformed structures. The specific number and the specific shape of the second bending portion 113 are not limited in the embodiments of the present disclosure.

In addition, along the first direction X, the thickness of the busbar 11 is consistent, that is, a projection of the busbar 11 in the second direction Y is in a shape of a rectangle, so as to simplify the structure of the busbar 11 and further reduce the machining cost of the busbar 11.

During the manufacturing of the busbar 11, the structure of the busbar 11 may be one structure in any one of the above embodiments, or two or more in the above embodiments may be combined to increase diversity and flexibility of the structure of the busbar 11.

In any one of the above embodiments, L1 and L2 satisfy $0 \leq L1-L2 \leq 0.5$ mm. For example, a difference between L1 and L2 may be 0 mm, 0.1 mm, 0.2 mm, 0.35 mm, 0.4 mm, 0.5 mm, or the like.

In this embodiment, if $L1-L2>0.5$ mm, the height of the electrode pad 12 is larger, which increases machining difficulty of the electrode pad 12 and increases machining materials of the electrode pad 12, thereby increasing the machining cost and the material cost of the electrode pad 12. Therefore, if $0 \leq L1-L2 \leq 0.5$ mm, the machining difficulty and the machining cost of the electrode pad 12 are reduced while there is a gap between the electrode line 2 and the busbar 11.

To sum up, as shown in FIG. 4, when the electrode pad 12 is arranged on the busbar 11, L1>L2. In this case, the busbar 11 may further have the first bending portion 112 as shown in FIG. 7, to increase a distance between the busbar 11 and the electrode line 2 and also reduce the height of the electrode pad 12. Additionally/alternatively, the busbar 11 may further have the recessed portion 114 as shown in FIG. 8, to increase the distance between the busbar 11 and the electrode line 2 and also reduce the height of the electrode pad 12. Additionally/alternatively, the busbar 11 may further have the second bending portion 113 as shown in FIG. 12, so that there is a gap between the busbar 11 and the electrode line in the first direction X and/or the second direction Y, thereby further increasing a size of the suspending region 22 of the electrode line 2.

When the electrode pad 12 is placed on the passivation layer 14 and the electrode pad 12 divides the busbar 11 into connection lines 111 as shown in FIG. 6 and when L1=L2, the busbar 11 has the first bending portion 112 as shown in FIG. 7, so that there is a gap between the busbar 11 and the electrode line 2 in the thickness direction Z of the photovoltaic cell 1. Additionally/alternatively, the busbar 11 has the recessed portion 114 as shown in FIG. 8, so that there is a gap between the busbar 11 and the electrode line 2 in the thickness direction Z of the photovoltaic cell 1. Additionally/alternatively, the busbar 11 has the second bending portion 113 as shown in FIG. 12, so that there is a gap between the busbar 11 and the electrode line 2 in the first direction X and/or the second direction Y.

As shown in FIG. 6, when the electrode pad 12 is placed on the passivation layer 14 and the electrode pad 12 divides the busbar 11 into connection lines 111 and when L1>L2, the busbar 11 has a same thickness in the thickness direction Z of the photovoltaic cell 1 along the first direction X. Alternatively, the busbar has one or more of the first bending portion 112 as shown in FIG. 7, the recessed portion 114 as shown in FIG. 8, and the second bending portion 113 as shown in FIG. 12.

In addition, in some embodiments, busbars 11 and electrode pads 12 have a same structure, so as to facilitate machining of the busbars 11 and the electrode pads 12, thereby shortening machining cycles of the busbars 11 and the electrode pads 12 and reducing machining costs of the busbars 11 and the electrode pads 12.

In some other embodiments, busbars 11 distributed along the second direction Y and the electrode pads 12 have different structures. That is, during actual machining and manufacturing, one part of the busbars 11 and the electrode pads 12 are machined according to the related art. That is, the busbars 11 and the electrode pads 12 are simultaneously manufactured, and after the electrode lines 2 are fixedly connected to the electrode pad 12, there are no gaps between the electrode line 2 and the part of the busbars 11. At the same time, structures of the other part of the busbars 11 and the electrode pads 12 are a combination of one or more structures in any one of the above embodiments, so that there are gaps between the electrode lines 2 and the part of the busbars 11.

In this embodiment, there is a gap between the electrode line 2 and part of the busbar 11, which reduces a total machining cost of the busbar 11 and reduces an influence of shrinkage of the electrode line 2 on the warping of the photovoltaic cell 1, thereby prolonging the service life and improve operation stability of the photovoltaic cell.

The above descriptions are only preferred embodiments of the present disclosure, and are not intended to limit the present disclosure. For those skilled in the art, various modifications and changes may be made to the present disclosure. Any modifications, equivalent replacements, improvements, and the like made within the spirit and the principle of the present disclosure shall fall within the protection scope of the present disclosure.

What is claimed is:

1. A photovoltaic cell, comprising:
a semiconductor substrate;
a passivation layer arranged on a surface of the semiconductor substrate;
a plurality of busbars arranged on the passivation layer, wherein the plurality of busbars extend along a first direction (X) and are spaced apart from one another along a second direction (Y), wherein one of the first direction (X) or the second direction (Y) is a length direction of the photovoltaic cell, and the other of the first direction (X) or the second direction (Y) is a width direction of the photovoltaic cell; and
a plurality of electrode pads electrically connected to an electrode line, wherein the plurality of electrode pads are arranged on a side of the plurality of busbars facing away from the passivation layer along a thickness direction (Z) of the photovoltaic cell, or wherein the plurality of electrode pads are arranged on the passivation layer along the thickness direction (Z) of the photovoltaic cell, wherein one of the plurality of busbars further comprises a plurality of connection lines spaced apart from each other along the first direction (X), and adjacent connection lines of the plurality of connection lines are electrically connected to each other through a corresponding electrode pad of the plurality of electrode pads,
wherein, along the thickness direction (Z) of the photovoltaic cell, a vertical distance between a highest point of the plurality of electrode pads and a surface of the passivation layer is L1, and a vertical distance between a highest point of the plurality of busbars and the surface of the passivation layer is L2,
wherein a third part of one of the plurality of busbars is bent towards the semiconductor substrate to form a recessed portion along the thickness direction (Z), such that a gap is formed between the electrode line and a busbar of the plurality of busbars in the thickness direction (Z), and
wherein other part of the one of the plurality of busbars that is not bent toward the semiconductor substrate is configured such that L1 is equal to L2.

2. The photovoltaic cell according to claim 1, wherein:
a contour of a section of the recessed portion in the thickness direction (Z) is in a shape of an arc, U, or V.

3. A photovoltaic module, comprising:
a plurality of photovoltaic cells, wherein adjacent photovoltaic cells of the plurality of photovoltaic cells are electrically connected through an electrode line, wherein each of the plurality of photovoltaic cells comprises a first surface and a second surface arranged on opposite sides of each of the plurality of photovoltaic cells along a thickness direction (Z) of each of the plurality of photovoltaic cells, and wherein the first surface is located on a side of each of the plurality of photovoltaic cells configured to face sunlight;
a first layer of photovoltaic glass arranged on the first surface, wherein a first adhesive film is arranged between the first layer of photovoltaic glass and the first surface; and
a back support structure arranged on the second surface, wherein a second adhesive film is arranged between the back support structure and the second surface;
wherein the back support structure is a back sheet comprising a second layer of photovoltaic glass,
wherein each of the plurality of photovoltaic cells comprises a semiconductor substrate, a passivation layer, a plurality of busbars, and a plurality of electrode pads, wherein the electrode line is electrically connected to a corresponding electrode pad of the plurality of electrode pads,
wherein the passivation layer is arranged on a surface of the semiconductor substrate,
wherein the plurality of busbars are arranged on the passivation layer, the plurality of busbars extending along a first direction (X) and spaced apart from each other along a second direction (Y), wherein one of the first direction (X) or the second direction (Y) is a length direction of the plurality of photovoltaic cells, and the other of the first direction (X) or the second direction (Y) is a width direction of the plurality of photovoltaic cells,
wherein the plurality of electrode pads are arranged on a side of the plurality of busbars facing away from the passivation layer along the thickness direction (Z) of each of the plurality of photovoltaic cells, wherein one of the plurality of busbars further comprises a plurality of connection lines spaced apart from each another along the first direction (X), and adjacent connection lines of the plurality of connection lines are electrically connected to each other through a corresponding electrode pad of the plurality of electrode pads,
wherein, along the thickness direction (Z) of the plurality of photovoltaic cells, a vertical distance between a highest point of the plurality of electrode pads and a surface of the passivation layer is L1, and a vertical distance between a highest point of the plurality of busbars and the surface of the passivation layer is L2,
wherein a third part of one of the plurality of busbars is bent towards the semiconductor substrate to form a recessed portion along the thickness direction (Z), such that a gap is formed between the electrode line and a busbar of the plurality of busbars in the thickness direction (Z), and
wherein other part of the one of the plurality of busbars that is not bent toward the semiconductor substrate is configured such that L1 is equal to L2.

4. The photovoltaic module according to claim 3, wherein a diameter (d) of the electrode line is $0.1 \text{ mm} \leq d \leq 0.5 \text{ mm}$.

5. The photovoltaic module according to claim 3, wherein:
a contour of a section of the recessed portion in the thickness direction (Z) is in a shape of an arc, U, or V.

* * * * *